United States Patent [19]
Yasuda et al.

[11] Patent Number: 5,359,202
[45] Date of Patent: Oct. 25, 1994

[54] ELECTRON BEAM EXPOSURE APPARATUS EMPLOYING BLANKING APERTURE ARRAY

[75] Inventors: Hiroshi Yasuda; Yoshihisa Oae; Tomohiko Abe, all of Kawasaki, Japan

[73] Assignee: Fujitsu Limited, Kawasaki, Japan

[21] Appl. No.: 95,424

[22] Filed: Jul. 23, 1993

[30] Foreign Application Priority Data

Jul. 24, 1992 [JP] Japan ................... 4-198615

[51] Int. Cl.⁵ ............................................ H01J 37/30
[52] U.S. Cl. ........................ 250/492.2; 250/492.22; 250/492.23
[58] Field of Search ............ 250/492.2, 492.22, 492.23, 250/492.3, 398

[56] References Cited

U.S. PATENT DOCUMENTS 4,742,234 5/1988 Feldman et al. ............... 250/492.2
5,260,579 11/1993 Yasuda et al. .................. 250/492.2

FOREIGN PATENT DOCUMENTS 57-181121 11/1982 Japan .

*Primary Examiner*—Jack I. Berman
*Attorney, Agent, or Firm*—Staas & Halsey

[57] ABSTRACT

An electron beam exposure apparatus is provided with an electron gun emitting an electron beam, a blanking aperture array including a plurality of two-dimensionally arranged blanking apertures for selectively deflecting the electron beam passing through the blanking apertures in a predetermined direction so as to shape the electron beam into a plurality of electron beams, a deflection device for regularly deflecting the electron beams passed through the blanking aperture array, and an electron beam controller for controlling the electron beams passed through the blanking aperture array so as to irradiate and expose an object surface. The electron gun has a needle shaped chip which comprises a pair of sloping surfaces which are <100> faces, and a vertex portion connecting the sloping surfaces and forming an inverted V-shape at a tip end of the needle shaped chip when viewed in a direction in which the vertex portion extends.

7 Claims, 17 Drawing Sheets

ELECTRON BEAM EXPOSURE APPARATUS EMPLOYING BLANKING APERTURE ARRAY

BACKGROUND OF THE INVENTION

The present invention generally relates to electron beam exposure apparatuses, and more particularly to an electron beam exposure apparatus which employs a blanking aperture array.

The integration density of integrated circuits (ICs) is increasing, and there are demands to expose extremely fine patterns on a wafer with a high accuracy. On the other hand, if mass production is taken into consideration, it is desirable that the wafer exposure technique enables a high throughput.

First, a description will be given of a conceivable electron beam exposure apparatus which employs a blanking aperture array in order to satisfy the above described demands, by referring to FIG. 1.

An electron beam exposure apparatus 1 shown in FIG. 1 employs a blanking aperture array and includes an electron gun 2, a blanking aperture array (BAA) 3, a main deflector 4 which is normally made up of coils, a sub deflector 5 which is normally made up of electrostatic electrodes, a stage 6 which supports a wafer 7, a blocking plate 8, converging lenses 10 through 15 and the like.

As shown in FIG. 2, the BAA 3 is made up of a substrate 20 which has a plurality of blanking apertures 21. For example, 128 blanking apertures 21 are provided in one row, and 8 such rows of blanking apertures 21 are provided in a zigzag arrangement as shown in FIG. 2. Each blanking aperture 21 includes a square aperture 22 which is 25 $\mu$m × 25 $\mu$m, a pair of mutually confronting electrodes 23 and 24 provided on opposing edges of the aperture 22, and a wiring pattern 25 which is drawn out from the electrodes 23 and 24. In FIG. 2, first through fourth rows of the blanking apertures 21 are respectively denoted by reference numerals 21-1 through 21-4.

The blanking aperture 21 functions as a normally-closed shutter. The blanking aperture 21 temporarily opens its shutter when activated so as to pass the electron beam and allow the electron beam to irradiate the wafer 7. In the present specification, "closing the shutter" of the blanking aperture 21 means deflecting the electron beam as the electron beam passes through the BAA 3, and "opening the shutter" of the blanking aperture 21 means allowing the electron beam to pass straight as it is without being deflected as the electron beam passes through the BAA 3.

As shown in FIG. 1, the electron beam exposure apparatus 1 also includes a controller 30 which controls the BAA 3 and the deflectors 4 and 5, and a laser interferometer 35. The controller 30 includes a beam ON/OFF signal generator 31, a central processing unit (CPU) 32, a memory 33 and a scan signal generator 34. The laser interferometer 35 detects the exposure position information and supplies this exposure position information to the scan signal generator 34 of the controller 30.

The memory 33 stores exposure information. The beam ON/OFF signal generator 31 is activated by the CPU 32, and receives data which are read out from the memory 33 under the control of the CPU 32. The beam ON/OFF signal generator 31 generates ON/OFF signals based on the data, and applies the ON/OFF signals independently to each blanking aperture 21 of the BAA 3. An electron beam which passes through the blanking aperture 21 is applied with the OFF signal will be referred to as an "OFF-beam", and the electron beam which passes through the blanking aperture 21 which is applied with the ON signal will be referred to as an "ON-beam". The OFF-beam will not reach the wafer 7, that is, will not irradiate the wafer 7. On the other hand, the ON-beam reaches the wafer 7, that is, irradiates the wafer 7.

As described above, the blanking apertures 21 are normally closed. Hence, the OFF signals are normally applied to the blanking apertures 21 of the BAA 3.

The beam ON/OFF signal generator 31 and the blocking plate 8 form an irradiating electron beam control means.

An electron beam 40 emitted from the electron gun 2 irradiates the BAA 3, and is shaped two-dimensionally by each blanking aperture 21. Hence, a plurality of OFF-beams 41 and ON-beams 42 are output from the BAA 3. An OFF-beam 41 is deflected and is blocked by the blocking plate 8 so as not to irradiate the wafer 7. On an other hand, the ON-beam 42 travels straight and is irradiated on the wafer 7 after being reduced to 1/500 via the lenses 12, 13, 14 and 15.

The scan signal generator 34 generates scan signals, that is, deflection voltages, based on the data read out from the memory 33 under the control of the CPU 32. The deflection voltages are applied to the deflectors 4 and 5. The sub deflector 5 and the scan signal generator 34 form a deflection means.

FIG. 3 shows an irradiating spot pattern 43 which is formed on the wafer 7 when the beams passing through the blanking apertures 21 of the BAA 3 are all ON beams 42. The irradiating spot pattern 43 generally corresponds to the arrangement of the blanking apertures 21 of the BAA 3 which is reduced to 1/500. Hence, a width $W_s$ in FIG. 3 is approximately 5 $\mu$m. A spot 45 (see FIG. 4) formed by one ON-beam 42 is extremely small and is 0.05 $\mu$m × 0.05 $\mu$m, for example.

As shown in FIG. 4, the bundle of the ON-beams 42 is regularly deflected, so that the irradiating spot pattern 43 successively scans sub field regions $SF_1$, $SF_2$ and $SF_3$ of the wafer 7 as indicated by arrows (1), (2) and (3) where a length $L_s$ of each region is 100 $\mu$m, for example. In FIG. 4, Y denotes an electron beam deflection (scan) direction and X denotes a deflection (scan) direction which is perpendicular to the deflection direction Y. On the other hand, in the BAA 3 shown in FIG. 2, each column of the blanking apertures 21 extends in the deflection (scan) direction Y, and each row of the blanking apertures 21 extends in the deflection (scan) direction X.

Next, a description will be given of the exposure operation of the electron beam exposure apparatus 1, by referring to FIGS. 5 and 6.

For the sake of convenience, it will be assumed that an exposing part 50 having a width of 0.05 $\mu$m is to be exposed on the wafer 7 as shown in FIG. 4. The exposing part 50 is exposed when the bundle of ON-beams 42 (that is, the irradiating spot pattern 43) is deflected once as indicated by the arrow (1) in FIG. 4, and the exposure of this exposing part 50 is completed by this one exposure.

In FIGS. 5 and 6, the top portion indicates the control state of each blanking aperture 21 of the BAA 3, the middle portion indicates the exposing part 50 which is to be exposed and the irradiated spot, and the bottom portion indicates the exposed state.

In FIGS. 5(A), 5(B), 5(C) and 6(A) and 6(B), the BAA 3 includes a first row of blanking apertures 21-1-1 through 21-1-4, a second row of blanking apertures 21-2-1 through 21-2-3, a third row of blanking apertures 21-3-1 through 23-3-4, and a fourth row of blanking apertures 21-4-1 through 21-4-3. Each blanking aperture 21 which is applied with an OFF signal is indicated by hatching, and each blanking aperture 21 which is applied with an ON signal is indicated without the hatching.

The irradiating spot pattern 43 is determined by the distribution of the ON-beams 42 which pass through the blanking apertures 21-1-1 through 21-4-3. An irradiating part 44-1-1 indicates a part which will be irradiated by an ON-beam assuming that the ON-beam passes through the blanking aperture 21-1-1. Similarly, irradiating parts 44-1-2 through 44-4-3 respectively indicate parts which will be irradiated by ON-beams assuming that the ON-beams respectively pass through the blanking apertures 21-1-2 through 21-4-3. The irradiating parts 44-1-1 through 44-4-3 are indicated by dotted lines.

In the middle portions of FIGS. 5(A), 5(B), 5(C) and 6(A) and 6(B), squares indicated by a solid line correspond to spots 45-1-1 through 45-4-3 which are formed by the irradiation of the ON-beams. As described above, each of these spots 45-1-1 through 45-4-3 have an extremely small size of 0.05 μm×0.05 μm.

FIG. 5(A) shows the state when the beam is deflected in the direction of arrow (1) in FIG. 4 by the sub deflector 5 and the sub field region $SF_1$ of the irradiating spot pattern 43 is scanned in the direction of arrow (1) up to a position immediately before the exposing part 50. In this state, all of the blanking apertures 21-1-1 through 21-4-3 are applied with OFF signals, and the irradiating spot pattern 43-1 includes no spot.

When the irradiating parts 44-1-1 through 44-1-4 at the leading position along the scan direction reach the exposing part 50 as shown in FIG. 5(B), 0N signals are temporarily applied to the first row of blanking apertures 21-1-1 through 21-1-4. Hence, the beams passing through the blanking apertures 21-1-1 through 21-1-4 are ON-beams 42 and reach the wafer 7. The spots 45-1-1 through 45-1-4 are formed on the exposing part 50, and a first divided exposure is carried out as indicated by the irradiating spot pattern 43-2. The exposure time of this first divided exposure is extremely short and is 0.25 nsec, for example. For this reason, it is possible to obtain a desired throughput.

In FIG. 5(B), the bottom portion shows first exposed parts 52-1 through 52-4 which are exposed by the first divided exposure, where the number within the circle indicates the number of divided exposures. This number is "1" in this case.

Next, when the irradiating parts 44-2-1 through 44-2-3 of the second (next) row reach the exposing part 50 as shown in FIG. 5(C), ON signals are temporarily applied to the second row of blanking apertures 21-2-1 through 21-2-3. As a result, the beams passing through the blanking apertures 21-2-1 through 21-2-3 are ON-beams 42 and reach the wafer 7. The spots 45-2-1 through 45-2-3 are formed on the exposing part 50, and the first divided exposure is carried out as indicated by the irradiating spot pattern 43-3.

In FIG. 5(C), the bottom portion shows first exposed parts 53-1 through 53-3 which are exposed by the first divided exposure, where the number within the circle indicates the number of divided exposures. This number is "1" in this case. In addition, the first exposed parts 53-1 through 53-3 are formed between the respective ones of the first exposed parts 52-1 through 52-4. Accordingly, the first exposed parts 52-1 through 52-4 and the first exposed parts 53-1 through 53-3 connect to form a line.

Next, when the irradiating parts 44-3-1 through 44-3-4 of the third row reach the exposing part 50 as shown in FIG. 6(A), ON signals are temporarily applied to the third row of blanking apertures 21-3-1 through 21-3-4. Hence, the beams passing through the blanking apertures 21-3-1 through 21-3-4 are ON-beams 42 and reach the wafer ?7. The spots 45-3-1 through 45-3-4 are formed on the exposing part 50, and a second divided exposure is carried out as indicated by the irradiating spot pattern 43-4 over the first exposed parts 52-1 through 52-4.

In FIG. 6(A), the bottom portion shows second exposed parts 54-1 through 54-4 which are exposed by the second divided exposure, where the number within the circle indicates the number of divided exposures. This number is "2" in this case.

Next, when the irradiating parts 44-4-1 through 44-4-3 of the fourth row reach the exposing part 50 as shown in FIG. 6(B), ON signals are temporarily applied to the fourth row of blanking apertures 21-4-1 through 21-4-3. As a result, the beams passing through the blanking apertures 21-4-1 through 21-4-3 are ON-beams 42 and reach the wafer 7. The spots 45-3-1 through 45-3-3 are formed on the exposing part 50, and the second divided exposure is carried out as indicated by the irradiating spot pattern 43-5 over the first exposed parts 53-1 through 53-3.

In FIG. 6(B), the bottom portion shows second exposed parts 55-1 through 55-3 which are exposed by the second divided exposure, where the number within the circle indicates the number of divided exposures. This number is "2" in this case. In addition, the second exposed parts 55-1 through 55-3 are formed between the respective ones of the second exposed parts 54-1 through 54-4. Accordingly, the second exposed parts 54-1 through 54-4 and the second exposed parts 55-1 through 55-3 connect to form a line. As a result, an extremely narrow line pattern 51 having a width of 0.05 μm is exposed by the two divided exposures made at the exposing part 50.

The exposure quantity of one exposure is extremely small, however, a desired exposure quantity can be obtained by repeating such exposures a plurality of times. The electron beam exposure employing the BAA 3 is carried out in the above described manner.

With regard to the deflecting direction Y of the irradiating spot pattern in FIG. 5(B), the degree of the exposure is averaged because the beams having a high intensity and distributed in the direction Y and the beams having a low intensity and distributed in the direction Y are irradiated in an overlapping manner. For this reason, the non-uniformity of the beam intensity distribution I in the direction Y shown in FIG. 6(B) does not become a problem.

On the other hand, with regard to the direction X which is perpendicular to the deflecting direction Y, only the beams having a high intensity are irradiated in an overlapping manner, and only the beams having a low intensity are irradiated in an overlapping manner. As a result, the non-uniformity of the beam intensity distribution II in the direction X shown in FIG. 6(B)

causes a non-uniform exposure in the longitudinal direction of a pattern which is long in the direction X.

Therefore, in order to carry out the electron beam exposure employing the BAA 3, the electron gun 2 must satisfy the following two conditions.

First, the beam intensity distribution must be uniform in the direction perpendicular to the deflecting direction of the electron beam, so that the degree of exposure becomes uniform.

Second, the beam intensity must not change with time. If the intensity of the electron beam were to weaken with time, the degree of exposure would gradually decrease. But if the exposure time were increase so as to compensate for the gradual decrease of the degree of exposure, the required control operation would be troublesome to carry out and the exposure time per unit area would increase, thereby deteriorating the throughput.

A general electron gun 2 has a construction shown in FIG. 7. The electron gun 2 includes a cathode 60, a Wehnelt cathode 61 and an anode 62. The cathode 60 includes needle shaped chip 63 which is made of a single crystal $LaB_6$, and an electron beam 40 is emitted from this needle shaped chip 63. A crossover point 64 is formed at a position shown in FIG. 7.

As may be seen from FIG. 8, the needle shaped chip 63 conventionally has a parallelepiped shape with a generally pyramid shaped tip end. Hence, the electron beam 40 emitted from the needle shaped chip 63 of the electron gun 2 has a Gaussian distribution in both the directions X and Y, as indicated by distributions III and IV in FIG. 9.

For this reason, the first condition described above cannot be satisfied by the needle shaped chip 63 because the intensity distribution of the electron beam in the direction X has the Gaussian distribution.

In addition, the tip end of the needle shaped chip 63 evaporates and is sublimated with time, and a <100> face appears at the tip end as shown in FIG. 10. As a result, the intensity of the electron beam 40 emitted from the needle shaped chip 63 gradually decreases, and the second condition described above cannot be satisfied.

In order to eliminate the above described problems, it is conceivable to use a needle shaped chip 80 shown in FIG. 11. The needle shaped chip 80 is made of a single crystal $LaB_6$, and has a parallelepiped shape with a tip end having a generally inverted V-shape in a vertical cross section. A vertex portion 81 is formed at the tip end of this needle shaped chip 80. The first condition described above can be satisfied because the intensity of the electron beam spreads uniformly in the longitudinal direction of the vertex portion 81.

As shown in FIG. 12, the needle shaped chip 80 is made by cutting a single crystal $LaB_6$ plate 85 which has a side surface which is the <100> face along a line 86, and cutting and polishing the tip end of the cut portion along lines 87 and 88.

Accordingly, two sloping surfaces 82 and 83 at the tip end of the needle shaped chip 80 are both the <110> face as shown in FIG. 11. The vertex portion 81 of the needle shaped chip 80 most easily evaporates with time, and a surface 84a having a narrow width appears as indicated by a two-dot chain line with time. This surface 84a is the <100> surface. But the <100> face more easily evaporates or wears compared to other faces such as the <110> face. For this reason, the surface 84a originally having the narrow width as shown in FIG. 11 gradually spreads and becomes a considerably side surface 84b as shown in FIG. 13 with time.

As the wear of the needle shaped chip 80 progresses to the extent shown in FIG. 13 and the tip end becomes the considerably wide surface 84b, the intensity of the electron beam emitted from the needle shaped chip 80 gradually decreases. As a result, the throughput of the wafer exposure deteriorates.

SUMMARY OF THE INVENTION

Accordingly, it is a general object of the present invention to provide a novel and useful electron beam exposure apparatus in which the problems described above are eliminated.

Another and more specific object of the present invention is to provide an electron beam exposure apparatus comprising an electron gun emitting an electron beam, a blanking aperture array including a plurality of two-dimensionally arranged blanking apertures for selectively deflecting the electron beam passing through the blanking apertures in a predetermined direction so as to shape the electron beam into a plurality of electron beams, deflection means for regularly deflecting the electron beams passed through the blanking aperture array, and electron beam control means for controlling the electron beams passed through the blanking aperture array so as to irradiate and expose an object surface, where the electron gun has a needle shaped chip which comprises a pair of sloping surfaces which are <100> faces, and a vertex portion connecting the sloping surfaces and forming an inverted V-shape at a tip end of the needle shaped chip when viewed in a direction in which the vertex portion extends. According to the electron beam exposure apparatus of the present invention, it is possible to uniformly and stably carry out the exposure using the blanking aperture array, and to improve the throughput. In other words, the high throughput can be maintained regardless of a change which occurs in the needle shaped chip of the electron gun with time.

Other objects and further features of the present invention will be apparent from the following detailed description when read in conjunction with the accompanying drawings.

DESCRIPTION OF THE PREFERRED EMBODIMENTS

Figure 14:
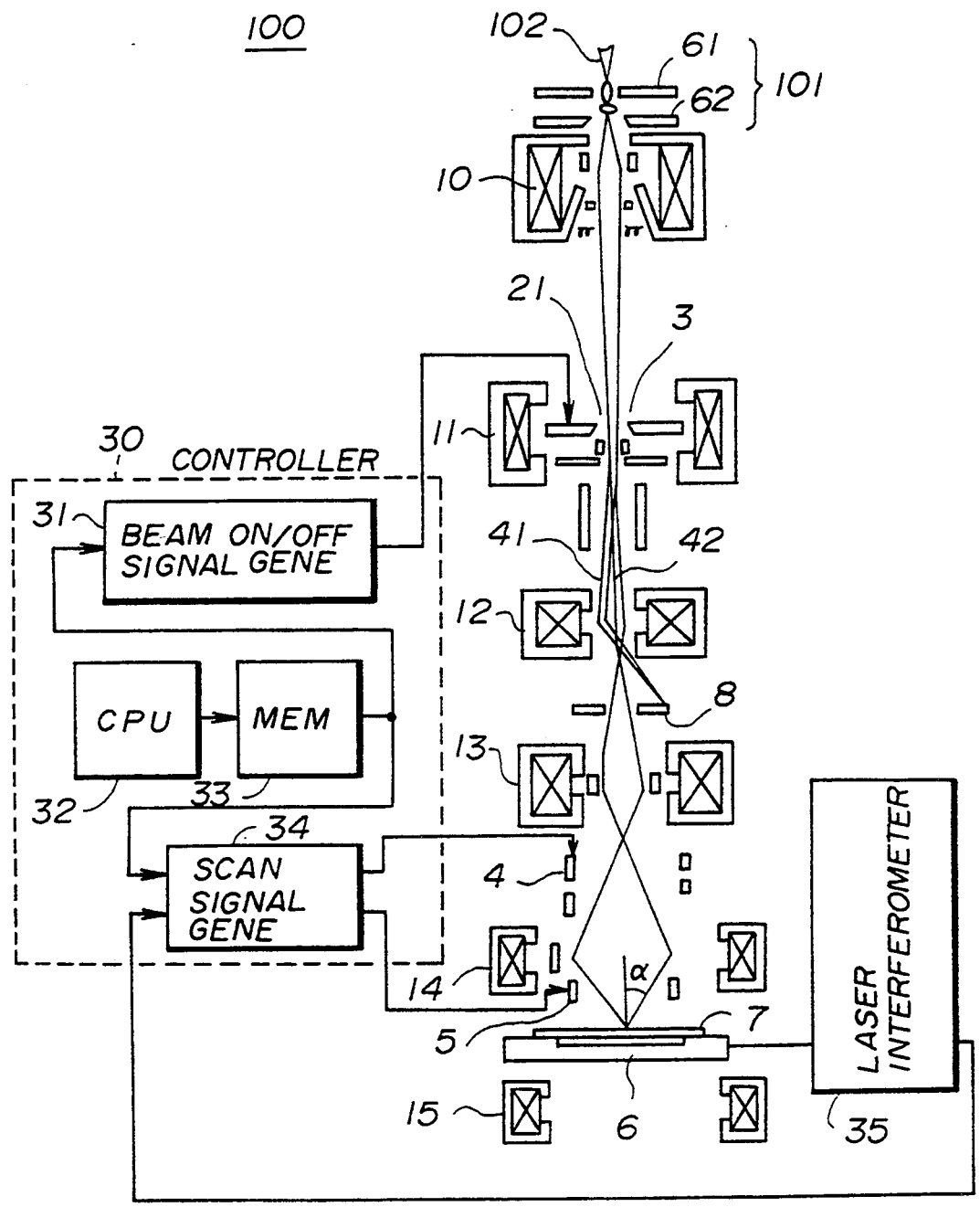
FIG. 14 is a diagram showing an embodiment of an electron beam exposure apparatus according to the present invention.

A description will be given of an embodiment of an electron beam exposure apparatus according to the present invention, by referring to FIG. 14. In FIG. 14, those parts which are the same as those corresponding parts in FIG. 1 are designated by the same reference numerals, and a description thereof will be omitted.

Figure 1:
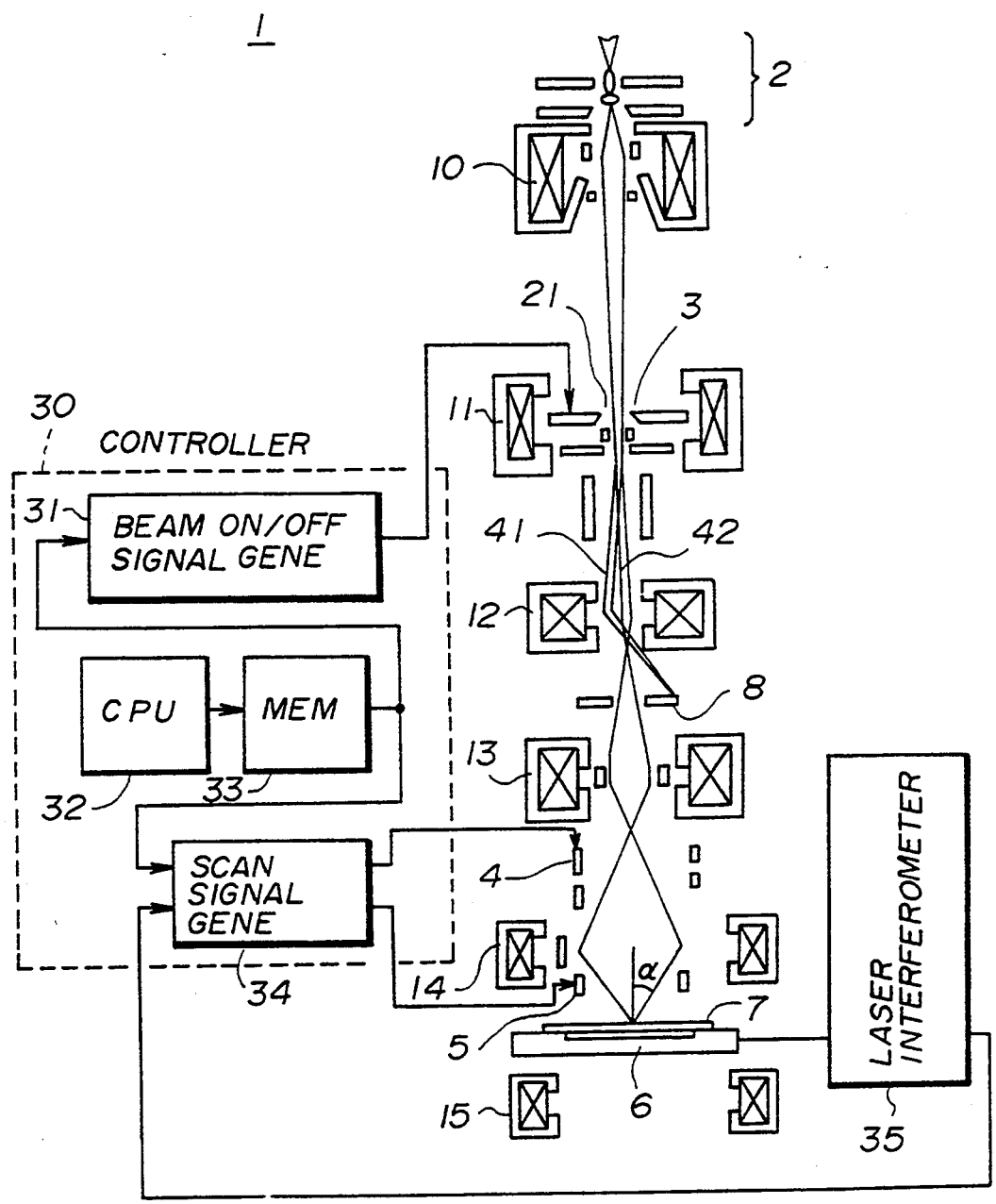
FIG. 1 is a diagram showing a conceivable electron beam exposure apparatus which employs a blanking aperture array.
Figure 2:
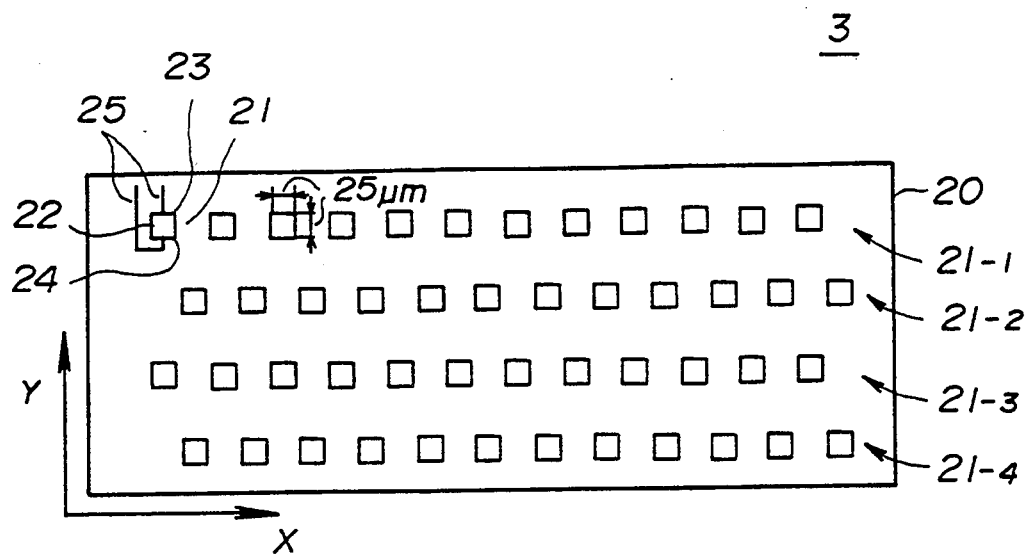
FIG. 2 is a plan view showing the blanking aperture array.
Figure 3:
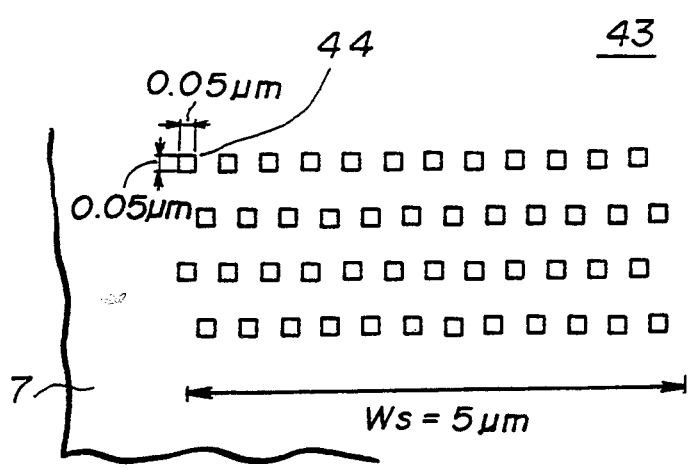
FIG. 3 is a diagram showing an irradiating spot pattern on a wafer when beams passing through blanking apertures of the blanking aperture array are all ON-beams.
Figure 4:
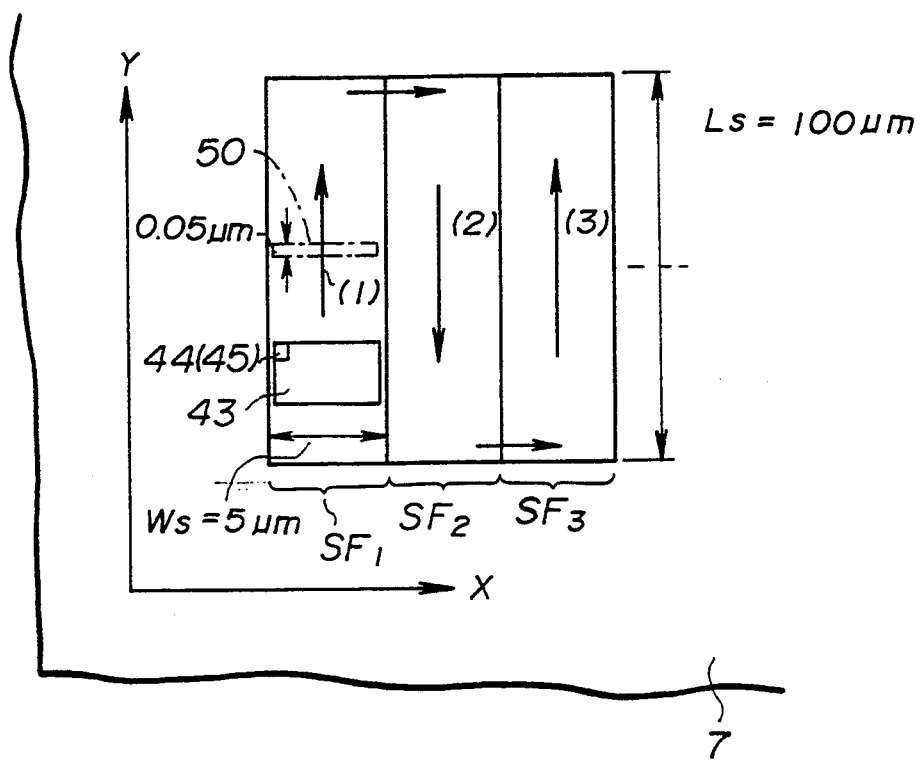
FIG. 4 is a diagram for explaining deflection of the electron beam by a sub deflector.
Figure 5A:
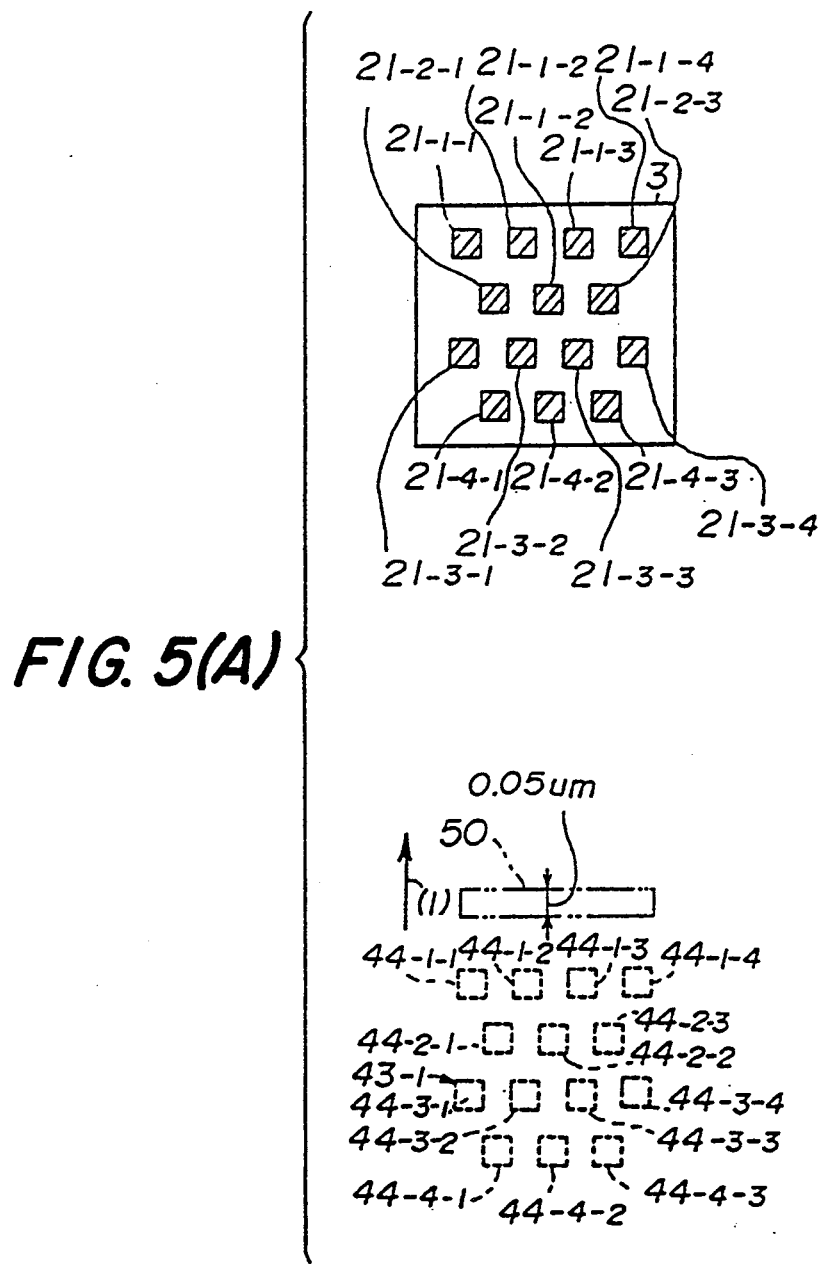
FIGS. 5(A), 5(B) and 5(C) are diagrams for explaining an exposure operation.
Figure 5B:
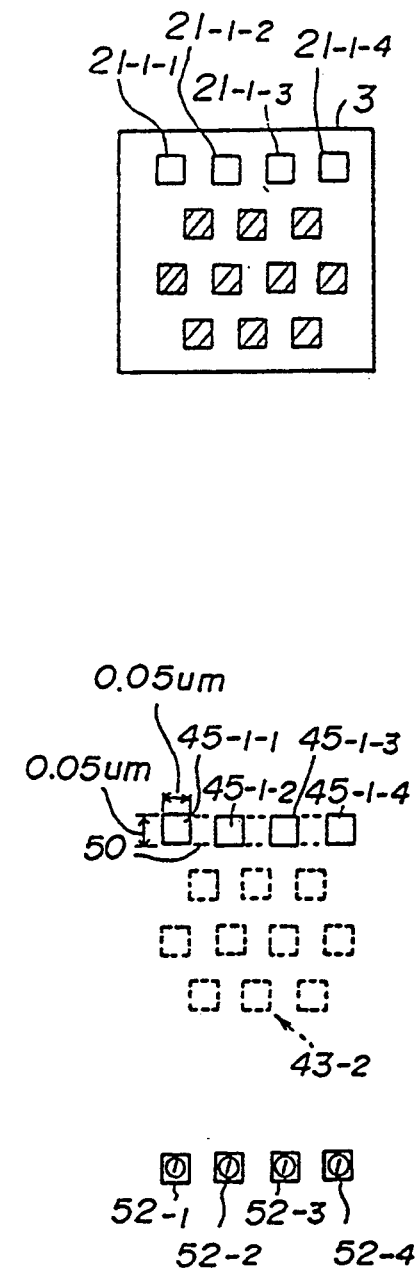
Figure 5C:
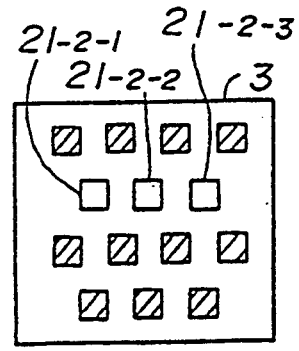
Figure 5C:
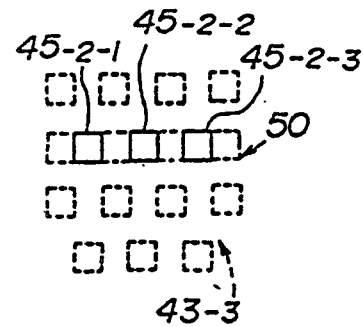
Figure 5C:
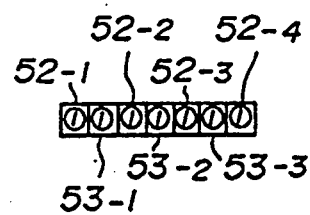
Figure 6A:
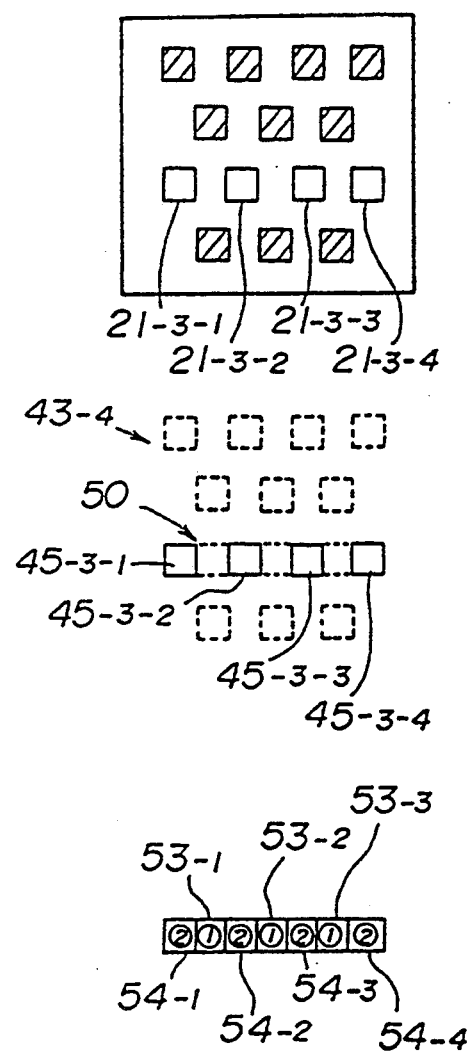
FIGS. 6(A) and 6(B) are diagrams for explaining the exposure operation.
Figure 6B:
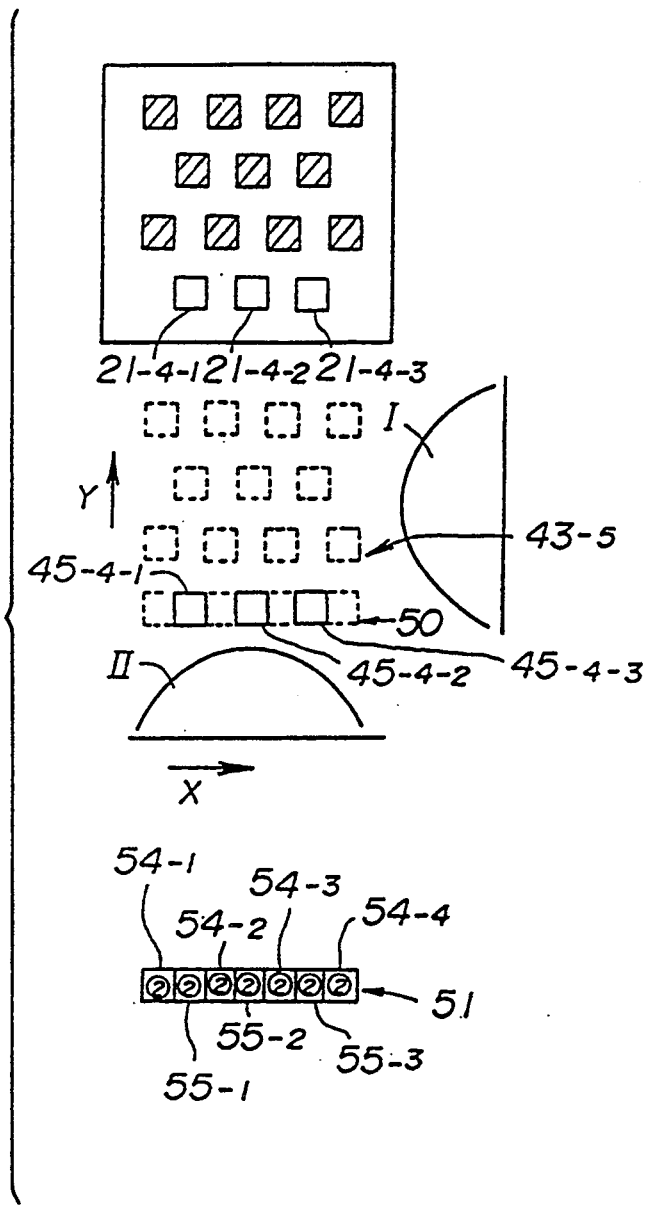
Figure 7:
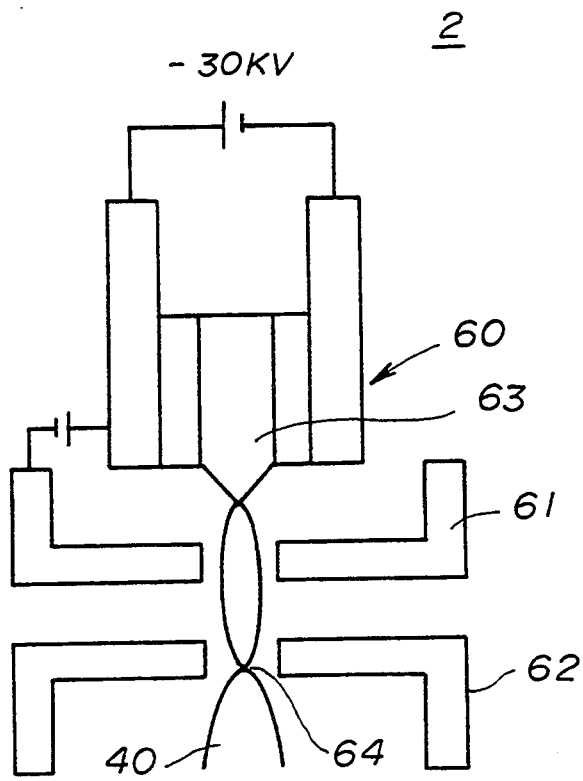
FIG. 7 is a diagram showing the construction of a general electron gun.
Figure 8:
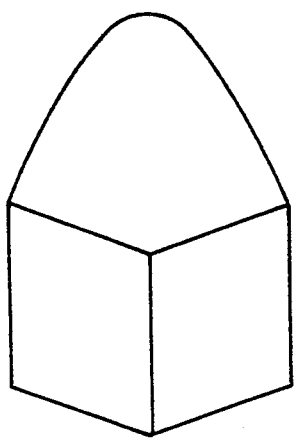
FIG. 8 is a perspective view showing a conventional needle shaped chip of the electron gun.
Figure 9:
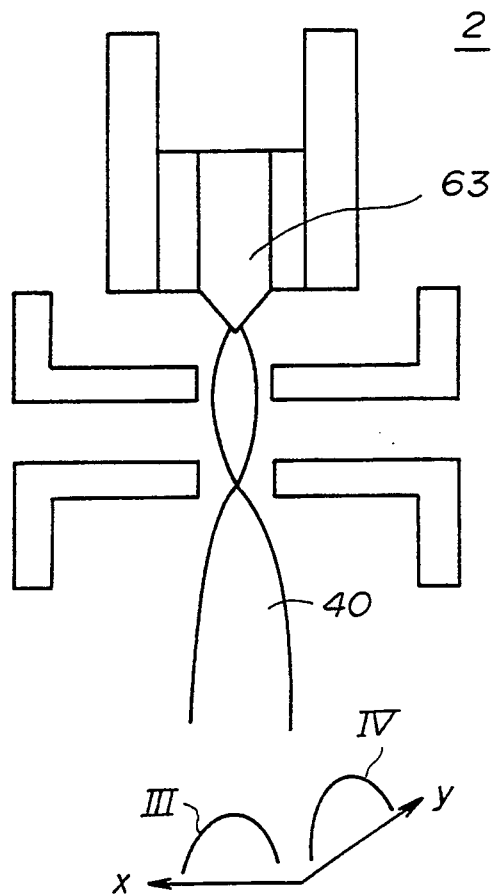
FIG. 9 is a diagram for explaining an intensity distribution of an electron beam emitted from the electron gun having the needle shaped chip shown in FIG. 8.
Figure 10:
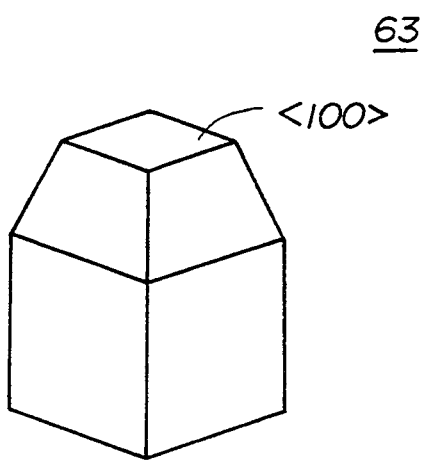
FIG. 10 is a perspective view for explaining a change of the needle shaped chip shown in FIG. 8 with time.
Figure 11:
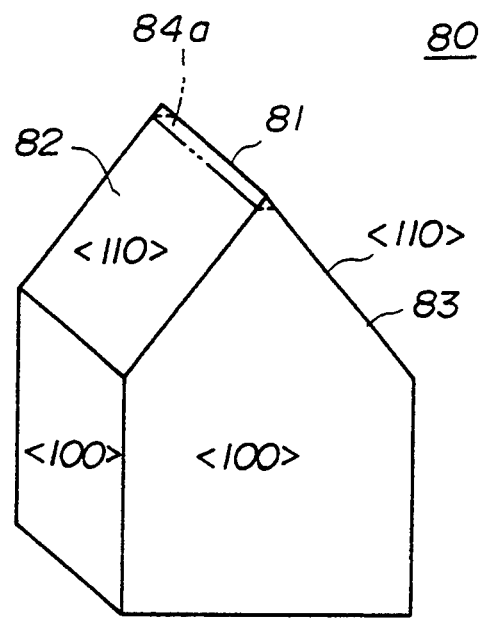
FIG. 11 is a perspective view showing a conceivable needle shaped chip of the electron gun.
Figure 13:
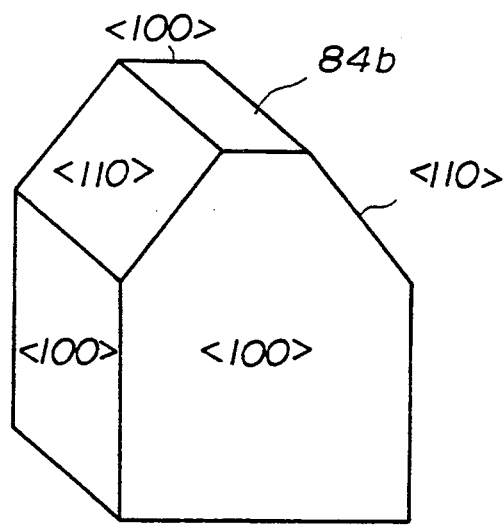
FIG. 13 is a perspective view for explaining a change of the conceivable needle shaped chip shown in FIG. 11 with time.
Figure 12:
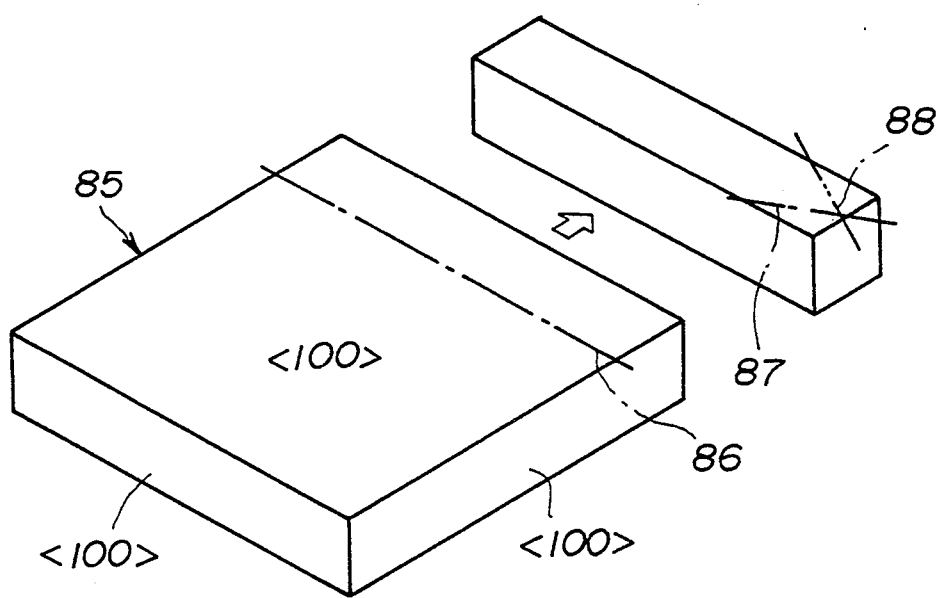
FIG. 12 is a perspective view for explaining a method of making the conceivable needle shaped chip shown in FIG. 11.

An electron beam exposure apparatus 100 shown in FIG. 14 mainly differs from the conceivable electron beam exposure apparatus 1 shown in FIG. 1, in that an electron gun 101 is provided in place of the electron gun 2. This electron gun 101 mainly differs from the electron gun 2 in that a needle shaped chip 102 shown in FIG. 15 is used in place of the needle shaped chip 63.

Figure 15:
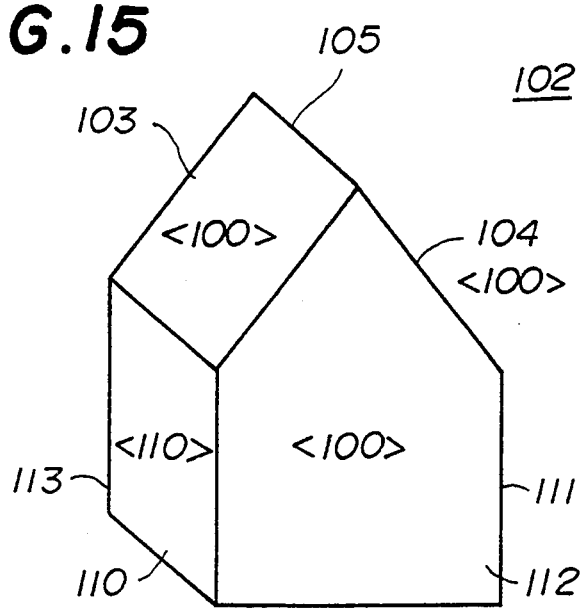
FIG. 15 is a perspective view showing an embodiment of a needle shaped chip of an electron gun used in the embodiment of the electron beam exposure apparatus.

The needle shaped chip 102 shown in FIG. 15 is made of a single crystal LaB$_6$, and has a parallelepiped shape with a tip end having a generally inverted V-shape in a vertical cross section. The tip end of this needle shaped chip 102 includes two sloping surfaces 103 and 104, and a vertex portion 105 where the two sloping surfaces 103 and 104 meet. Both the two sloping surfaces 103 and 104 are <100> faces.

Figure 16:
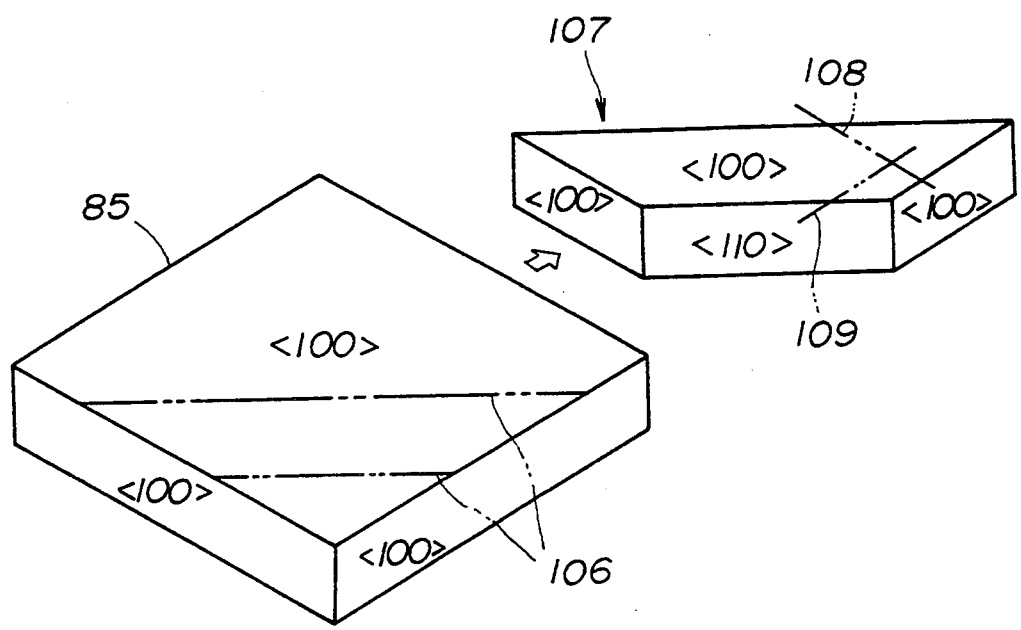
FIG. 16 is a perspective view for explaining a method of making the needle shaped chip shown in FIG. 15.

As shown in FIG. 16, the needle shaped chip 102 is made by cutting a single crystal LaB$_6$ plate 85, which has a side surface which is the <100> face, along two oblique lines 106 as indicated by a two-dot chain line to obtain a cut portion 107, and cutting and polishing the tip end of the cut portion 107 along lines 108 and 109.

Accordingly, both the sloping surfaces 103 and 104 are <100> faces as described above, and side surfaces 110 and 111 respectively connecting to the sloping surfaces 103 and 104 are both <110> faces. On the other hand, side surfaces 112 and 113 on both ends of the vertex portion 105 are both <100> faces. The side surfaces 110 and 111 of the needle shaped chip 102 are sandwiched between graphite electrodes 115 and 116 of the electron gun 101, as shown in FIG. 18 which will be described later.

Next, a description will be given of the relative position of the electron gun 101 which has the needle shaped chip 102 with respect to the BAA 3.

Figure 17:
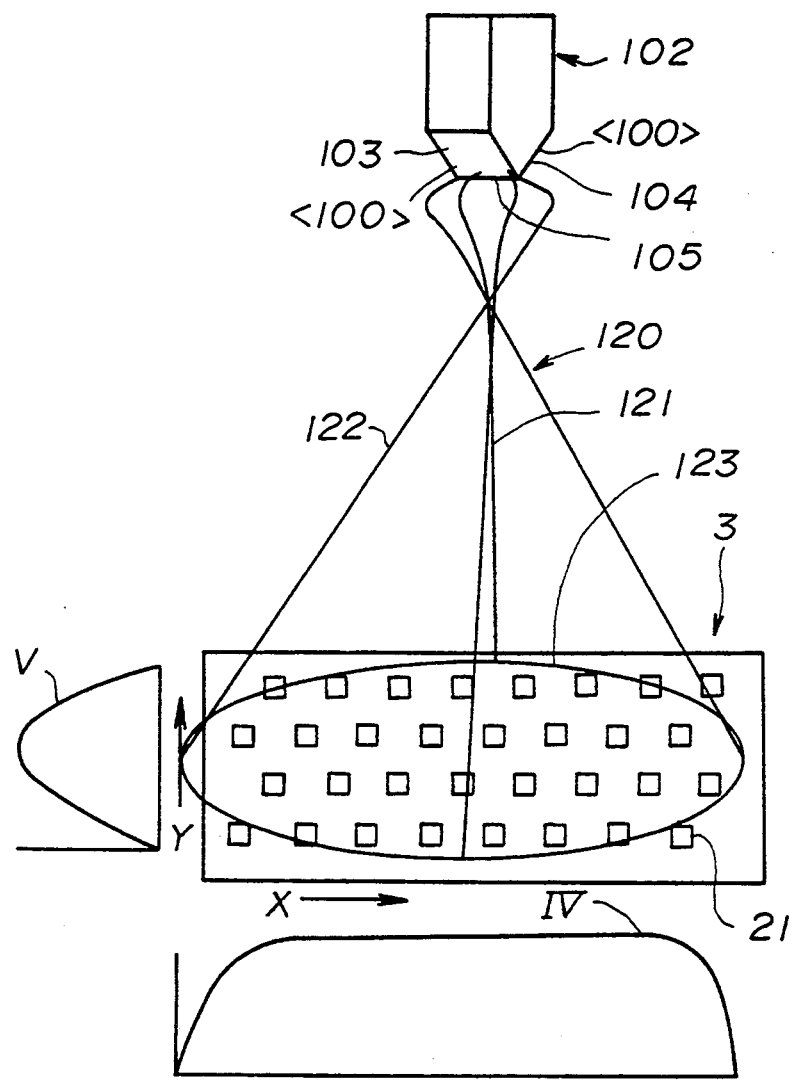
FIG. 17 is a diagram showing the relationship of the electron gun and a blanking aperture array.

As shown in FIG. 17, the electron gun 101 is arranged so that the vertex portion 105 of the needle shaped chip 102 is parallel to the X-axis which is perpendicular to the electron beam deflection direction Y. The vertex portion 105 is parallel to the X-axis in that the electron beam emitted from the ends of the vertex portion 105 becomes aligned to the X-axis on the BAA 3 in FIG. 17 when the electron beam is rotated by the converging lenses. In other words, the electron beam is parallel to the X-axis if the rotation of the electron beam caused by the converging lenses is disregarded.

Figure 18:
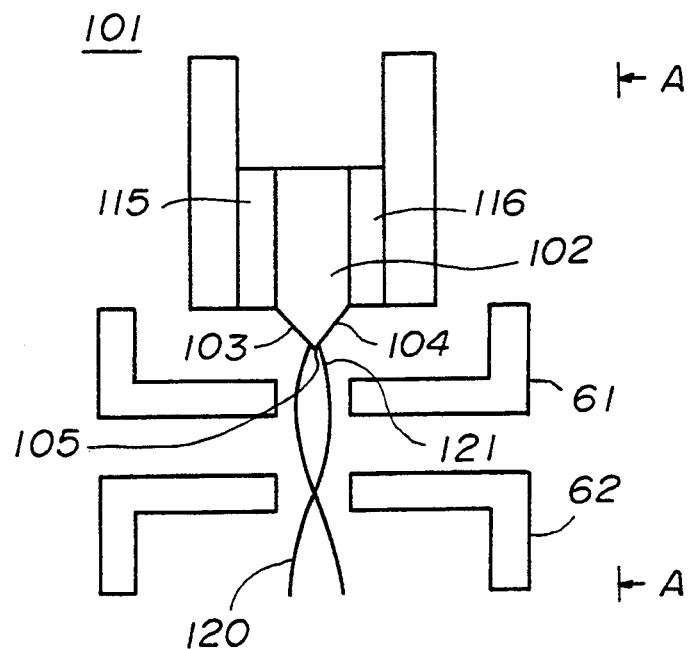
FIG. 18 is a diagram showing the electron gun on an enlarged scale.
Figure 19:
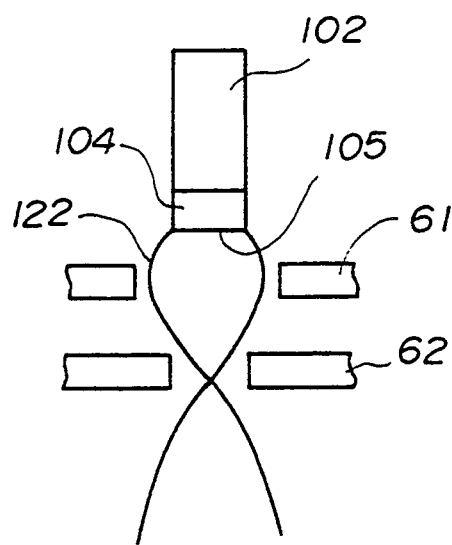
FIG. 19 is a cross sectional view of the electron gun taken along a line A—A in FIG. 18.

If the state of an electron beam 120 emitted from the tip end of the needle shaped chip 102 is viewed in a direction in which the vertex portion 105 extends, the electron beam 120 does not spread greatly as indicated by a reference numeral 121 in FIG. 18. On the other hand, if the state of the electron beam 120 emitted from the tip end of the needle shaped chip 102 is viewed in a direction perpendicular to the direction in which the vertex portion 105 extends, the electron beam 120 spreads greatly as indicated by a reference numeral 122 in FIG. 19.

Accordingly, the electron beam 120 which is emitted from the tip end of the needle shaped chip 102 forms an irradiating spot 123 on the BAA 3 as shown in FIG. 17. In other words, the irradiating spot 123 has an oval shape which is longer in the X-axis direction. The electron beam intensity distribution of the irradiating spot 123 is a Gaussian distribution V with respect to the Y-axis direction as may be seen from FIG. 17, however, is an approximately constant distribution VI with respect to the X-axis direction. In other words, the distribution VI is approximately constant along the X-axis direction. Therefore, it is possible to satisfy the first condition described above.

Next, a description will be given of the change in the needle shaped chip 102 with time.

Figure 20:
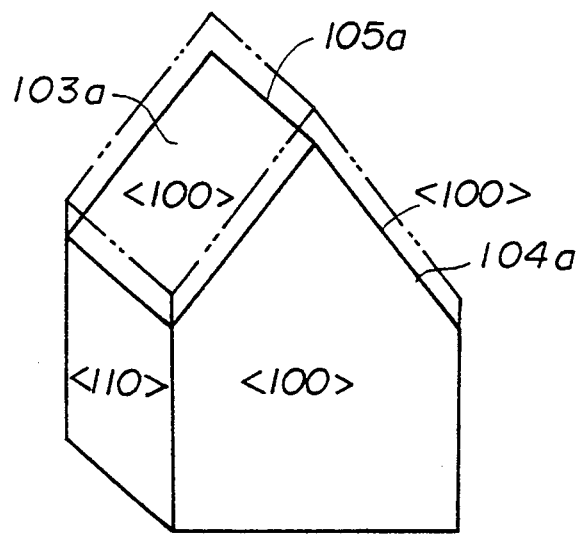
FIG. 20 is a perspective view for explaining a change in the needle shaped chip shown in FIG. 15 with time.

As shown in FIG. 15, the sloping surfaces 103 and 104 are <100> faces which easily wear. Hence, the sloping surfaces 103 and 104 wear out with time and a change accordingly occurs in the needle shaped chip 102 with time. However, when such wear takes place, the sloping surfaces 103 and 104 recede in their entirety as shown in FIG. 20. In other words, the sloping surfaces 103 and 104 recede from the state indicated by a two-dot chain line in FIG. 20 to the sloping surfaces 103a and 104a indicated by a solid line. For this reason, although the vertex portion 105 also recedes to a vertex portion 105a, the vertex portion 105a is maintained sharp and straight, thereby maintaining the inverted V-shape at the tip end of the needle shaped chip 102.

Accordingly, although the change occurs in the needle shaped chip 102 with time, the electron beam 120 which is emitted from the top end of the needle shaped chip 102 continues to have the same intensity as before the change occurred. In other words, the intensity of the electron beam emitted from the needle shaped chip 102 is maintained approximately constant regardless of the change which occurs with time. Therefore, it is also possible to satisfy the second condition described above.

Because it is possible to simultaneously satisfy the first and second conditions described above, it is possible to stably expose the wafer 7 at a high throughput.

In the embodiment described above, the side surfaces 110 and 111 of the needle shaped chip 102 are sandwiched between the graphite electrodes 115 and 116 of the electron gun 101. However, it is not essential to sandwich the needle shaped chip 102 between the graphite electrodes 115 and 116. In addition, the material used for the needle shaped chip 102 is not limited to $LaB_6$ and other suitable materials such as rare earth compound crystals may be used.

Further, the present invention is not limited to these embodiments, but various variations and modifications may be made without departing from the scope of the present invention.

What is claimed is:

1. An electron beam exposure apparatus which exposes a surface of an object, the electron beam exposure apparatus comprising:
   an electron gun which emits an electron beam;
   a blanking aperture array to which the electron beam is directed and including a plurality of two-dimensionally arranged blanking apertures for selectively deflecting the electron beam passing through the blanking apertures in a predetermined direction so as to shape the electron beam into a plurality of electron beams passing through the blanking aperture array;
   deflection means for deflecting the plurality of electron beams passing through said blanking aperture array; and
   electron beam control means for controlling the plurality of electron beams passing through said blanking aperture array so as to irradiate and expose the surface of the object,
   said electron gun having a needle shaped chip which comprises:
   a pair of sloping surfaces which are <100> faces; and
   a vertex portion defining a tip end of the needle shaped chip and connecting the sloping surfaces, the vertex portion forming an inverted V-shape when viewed in a direction in which the vertex portion extends.

2. The electron beam exposure apparatus as claimed in claim 1, wherein said blanking apertures of said blanking aperture array are arranged in rows extending in a first direction and the electron beam emitted by said electron gun scans in a second direction which is substantially perpendicular to the first direction, the vertex portion of the needle shaped chip extending in a direction which is approximately parallel to the first direction.

3. The electron beam exposure apparatus as claimed in claim 1, wherein the pair of sloping surfaces define a first pair of mutually confronting side surfaces of the needle shaped chip, each side surface of the first pair of mutually confronting side surfaces being a pentagonal shaped <100> face.

4. The electron beam exposure apparatus as claimed in claim 3, wherein the needle shaped chip has a second pair of mutually confronting side surfaces, each side surface of the second pair of mutually confronting side surfaces being connected to a different, respective sloped surface of the pair of sloped surfaces and being a rectangular shaped <110> face.

5. The electron beam exposure apparatus as claimed in claim 4, wherein the needle shaped chip is made of a rare earth compound crystal.

6. The electron beam exposure apparatus as claimed in claim 1, wherein the needle shaped chip is made of a rare earth compound crystal.

7. The electron beam exposure apparatus as claimed in claim 1, wherein said electron beam control means controls the plurality of electron beams passing through said blanking aperture array so that a specific portion of the surface of the object is irradiated and exposed a plurality of times by the controlled plurality of electron beams.

* * * * *

UNITED STATES PATENT AND TRADEMARK OFFICE
CERTIFICATE OF CORRECTION

PATENT NO. : 5,359,202
DATED : October 25, 1994
INVENTOR(S) : Hiroshi YASUDA et al.

It is certified that error appears in the above-indentified patent and that said Letters Patent is hereby corrected as shown below:

Col. 1, line 63, delete "are" and insert therefor --is--.
Col. 2, line 1, delete "is";
Line 3, delete "which is".
Col. 4, line 13, delete "?7" and insert therefor --7--.
Col. 5, line 13, delete "increase" and insert therefor --increased--.
Col. 6, line 2, delete "side" and insert therefor --wide--.

Signed and Sealed this

Ninth Day of May, 1995

Attest:

BRUCE LEHMAN

*Attesting Officer*     *Commissioner of Patents and Trademarks*